(12) United States Patent
Khanarian et al.

(10) Patent No.: US 9,040,114 B2
(45) Date of Patent: May 26, 2015

(54) METHOD OF MANUFACTURING SILVER MINIWIRE FILMS

(71) Applicant: Rohm and Haas Electronic Materials LLC, Marlborough, MA (US)

(72) Inventors: Garo Khanarian, Princeton, NJ (US); Kathleen M. O'connell, Cumberland, RI (US); Peter Trefonas, Medway, MA (US); Jerome Claracq, Oostakker (BE); Lijia Bu, Southborough, ME (US); Jaebum Joo, Somerville, ME (US)

(73) Assignee: Rohm and Haas Electronic Material LLC, Marlborough, MA (US)

( * ) Notice: Subject to any disclaimer, the term of this patent is extended or adjusted under 35 U.S.C. 154(b) by 69 days.

(21) Appl. No.: 13/968,138

(22) Filed: Aug. 15, 2013

(65) Prior Publication Data

US 2014/0065300 A1   Mar. 6, 2014

Related U.S. Application Data

(60) Provisional application No. 61/694,296, filed on Aug. 29, 2012.

(51) Int. Cl.
| | | |
|---|---|---|
| *B05D 5/12* | (2006.01) | |
| *H01B 13/00* | (2006.01) | |
| *G06F 3/041* | (2006.01) | |
| *H01L 31/18* | (2006.01) | |
| *H05K 1/09* | (2006.01) | |

(52) U.S. Cl.
CPC ............. *H01B 13/00* (2013.01); *G06F 3/041* (2013.01); *H01L 31/1884* (2013.01); *H05K 1/097* (2013.01); *G06F 2203/04103* (2013.01); *H05K 2201/0108* (2013.01); *H05K 2201/0224* (2013.01); *H05K 2201/0326* (2013.01); *Y02E 10/50* (2013.01)

(58) Field of Classification Search
CPC .............. H05K 2201/0108; H05K 2201/0224; H05K 2201/0326; H05K 1/097; G06F 3/041; G06F 2203/04103; H01B 13/00
USPC .......................................... 427/125
See application file for complete search history.

(56) References Cited

U.S. PATENT DOCUMENTS

| | | | |
|---|---|---|---|
| 7,060,241 B2 | 6/2006 | Glatkowski | |
| 7,868,351 B2 | 1/2011 | Taniguchi et al. | |
| 8,212,792 B2 | 7/2012 | Kent | |
| 2009/0140210 A1* | 6/2009 | Toshioka et al. ............... | 252/500 |
| 2009/0233086 A1 | 9/2009 | Hirai | |
| 2010/0307792 A1* | 12/2010 | Allemand et al. .......... | 174/126.1 |
| 2011/0285019 A1 | 11/2011 | Alden et al. | |
| 2012/0055013 A1* | 3/2012 | Finn ................................ | 29/600 |
| 2012/0251824 A1* | 10/2012 | Hur et al. ....................... | 428/378 |

FOREIGN PATENT DOCUMENTS

WO    WO2012017218 A2 *   2/2012   ................... 427/125

OTHER PUBLICATIONS

Cinar et al. "Synthesis of Silver Nanoparticles by Oleylamine-Oleic Acid Reduction and Its Use in Making Nanocable by Coaxial Electrospinning" J. Nanosci. Nanotechnol. 2011, vol. 11, No. 4, 3669-3679.*

Sun et al. "Compound Core-Shell Polymer Nanofibers by Co-electrospinning" 2003, Advanced Materials, 15 No. 22 1929-1932.*

* cited by examiner

*Primary Examiner* — Michael Wieczorek
*Assistant Examiner* — Sarah R Anderson
(74) *Attorney, Agent, or Firm* — Thomas S. Deibert

(57) ABSTRACT

A method of manufacturing a silver miniwire film is provided, wherein the film exhibits a reduced sheet resistance.

7 Claims, No Drawings

METHOD OF MANUFACTURING SILVER MINIWIRE FILMS

This application claims priority to U.S. Provisional Application No. 61/694,296 filed on Aug. 29, 2012.

The present invention relates generally to the field of manufacture of conductive films. In particular, the present invention is directed to a method of manufacturing a silver miniwire conductive film exhibiting a reduced sheet resistance.

Films that exhibit a high conductivity in combination with a high transparency are of great value for use as electrodes or coatings in a wide range of electronic applications, including, for example, touch screen displays and photovoltaic cells. Current technology for these applications involves the use of a tin doped indium oxide (ITO) containing films that are deposited through physical vapor deposition methods. The high capital cost of physical vapor deposition processes has led to the desire to find alternative transparent conductive materials and coating approaches.

An alternative to ITO films is disclosed by Hirai in United States Patent Application Publication No. 2009/0233086. Hirai discloses a transparent conductive film including metal oxide microparticles having a mean particle diameter of 2 nm to 1,000 nm and silver nanowires having a minor axis diameter of 2 nm to 100 nm and an aspect ratio of 10 to 200.

Notwithstanding, there remains a need for alternative methods for preparing conductive silver miniwire films. In particular, for methods of manufacturing conductive silver miniwires films exhibiting a reduced sheet resistance properties.

The present invention provides a method of manufacturing a silver miniwire film, comprising: providing a plurality of silver miniwires; providing a plurality of nonconductive spheres, wherein the plurality of nonconductive spheres have an average particle size of ≤300 µm; optionally, providing a matrix material; optionally, providing a vehicle; providing a substrate; combining the plurality of silver miniwires, the plurality of nonconductive spheres, the optional matrix material and the optional vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a plurality of silver miniwires; providing a plurality of nonconductive spheres, wherein the plurality of nonconductive spheres have an average particle size of ≤300 µm; providing a matrix material; optionally, providing a vehicle; providing a substrate; combining the plurality of silver miniwires, the plurality of nonconductive spheres, the matrix material and the optional vehicle to form a combination; applying the combination to a surface of the substrate to form a film; removing any volatile components from the film fanned on the substrate; wherein the film formed on the surface of the substrate exhibits a reduced sheet resistance.

The present invention provides a method of manufacturing a silver miniwire film, comprising: providing a plurality of silver miniwires; providing a plurality of nonconductive spheres, wherein the plurality of nonconductive spheres have an average particle size of ≤300 µm; optionally, providing a matrix material; providing a vehicle; providing a substrate; combining the plurality of silver miniwires, the plurality of nonconductive spheres, the optional matrix material and the vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a plurality of silver miniwires; providing a plurality of nonconductive spheres, wherein the plurality of nonconductive spheres have an average particle size of ≤300 µm; providing a matrix material; providing a vehicle; providing a substrate; combining the plurality of silver miniwires, the plurality of nonconductive spheres, the matrix material and the vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a silver ink core component containing ≥60 wt % silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; treating the silver nanoparticles to form a plurality of silver miniwires, wherein the plurality of silver miniwires exhibit an average length, L, of ≥10 µm; providing a plurality of nonconductive spheres, wherein the plurality of nonconductive spheres have an average particle size of ≤300 µm; optionally, providing a matrix material; optionally, providing a vehicle; providing a substrate; combining the plurality of silver miniwires, the plurality of nonconductive spheres, the optional matrix material and the optional vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a silver ink core component containing ≥60 wt % silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; treating the silver nanoparticles to form a plurality of silver miniwires, wherein the plurality of silver miniwires exhibit an average length, L, of ≥10 µm; providing a plurality of nonconductive spheres, wherein the plurality of nonconductive spheres have an average particle size of ≤300 µm; providing a matrix material; optionally, providing a vehicle; providing a substrate; combining the plurality of silver miniwires, the plurality of nonconductive spheres, the matrix material and the optional vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a silver ink core component containing ≥60 wt % silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; treating the silver nanoparticles to form a plurality of silver miniwires, wherein the plurality of silver miniwires exhibit an average length, L, of ≥10 μm; providing a plurality of nonconductive spheres, wherein the plurality of nonconductive spheres have an average particle size of ≤300 μm; optionally, providing a matrix material; providing a vehicle; providing a substrate; combining the plurality of silver miniwires, the plurality of nonconductive spheres, the optional matrix material and the vehicle to form a combination; applying the combination to a surface of the substrate to form a film; removing any volatile components from the film formed on the substrate; wherein the film formed on the surface of the substrate exhibits a reduced sheet resistance.

The present invention provides a method of manufacturing a silver miniwire film, comprising: providing a silver ink core component containing ≥60 wt % silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; treating the silver nanoparticles to form a plurality of silver miniwires, wherein the plurality of silver miniwires exhibit an average length, L, of ≥10 μm; providing a plurality of nonconductive spheres, wherein the plurality of nonconductive spheres have an average particle size of ≤300 μm; providing a matrix material; providing a vehicle; providing a substrate; combining the plurality of silver miniwires, the plurality of nonconductive spheres, the matrix material and the vehicle to form a combination; applying the combination to a surface of the substrate to form a film; removing any volatile components from the film formed on the substrate; wherein the film formed on the surface of the substrate exhibits a reduced sheet resistance.

The present invention provides a silver miniwire film prepared using the method of the present invention.

The present invention provides a touch screen containing a silver miniwire film prepared using the method of the present invention.

DETAILED DESCRIPTION

The term "silver miniwires" as used herein and in the appended claims refers to silver nanostructures exhibiting a long dimension (length, L) and a short dimension (diameter, D), wherein the average aspect ratio, L/D, of the silver miniwires is ≥100.

The term "high aspect ratio" as used herein and in the appended claims in reference to the recovered silver miniwires means that the average aspect ratio, L/D, of the recovered silver miniwires is >100. Preferably, the recovered silver miniwires exhibit an average aspect ratio of ≥200. Most preferably, the recovered silver miniwires exhibit an average aspect ratio of ≥1,000.

The term "reduced sheet resistance" as used herein and in the appended claims in reference to a film formed on the surface of a substrate means that the sheet resistance of the film formed on the surface of the substrate using the method of the present invention ("the inventive method") is less than the sheet resistance exhibited by a film formed using an identical combination of materials and deposition method with the exception that the material deposited does not contain the plurality of nonconductive spheres ("the comparative method").

The substrate provided in the method of the present invention can be selected from any known materials both conductive and nonconductive. Preferred substrates include glass (e.g., Willow® glass available from Corning, Inc.), plastic film (e.g., polyethylene, polyethylene terephthalate, polycarbonate, poly methyl methacrylate), metals (e.g., aluminum, copper), conductive treated papers, conductive treated nonwoven fabrics, conductive liquid baths (e.g., water, water electrolyte mixtures). Preferably, the substrate provided in the method of the present invention is selected for later incorporation into a device (e.g., as part of a transparent conductor assembly in a touch screen device).

The plurality of silver miniwires used in the method of the present invention are not particularly limited. One of ordinary skill in the art given the teachings provided herein will be able to selected appropriate silver miniwires for use in the method of the present invention. Preferably, the silver miniwires used in the method of the invention preferably will exhibit a high aspect ratio. Preferably, the silver miniwires exhibit an average diameter, D, of 10 nm to 5 μm (preferably 50 nm to 5 μm; more preferably 75 nm to 5 μm; still more preferably 100 nm to 5 μm; most preferably 1 μm to 5 μm) and an average length, L, of ≥10 μm (preferably 10 to 10,000 μm; more preferably 20 to 10,000 μm; still more preferably 60 to 10,000 μm; most preferably 500 to 10,000 μm). Preferably, the silver miniwires exhibit an aspect ratio, L/D, of ≥100 (more preferably 200 to 10,000; still more preferably 500 to 10,000; most preferably 1,000 to 10,000).

Preferably, the plurality of silver miniwires used in the method of the present invention are provided by a process, comprising: providing a silver ink core component containing ≥60 wt % silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; and, treating the silver nanoparticles to form a plurality of silver miniwires, wherein the plurality of silver miniwires exhibit an average length, L, of ≥10 μm (more preferably, >60 μm).

More preferably, the plurality of silver miniwires used in the method of the present invention are provided by a process, comprising: providing a silver ink core component containing ≥60 wt % silver nanoparticles dispersed in a silver carrier; providing a shell component containing a film forming polymer dispersed in a shell carrier; wherein the silver carrier and the shell carrier are selected such that the interfacial tension between the shell component and the silver ink core component is 2 to 10 mN/m (preferably 2 to 5 mN/m); providing a target; coelectrospinning the silver ink core component and the shell component depositing on the target a core shell fiber having a core and a shell surrounding the core, wherein the silver nanoparticles are in the core; and, treating the silver nanoparticles to form a plurality of silver miniwires, wherein the plurality of silver miniwires exhibit an average length, L, of ≥10 μm (more preferably, ≥60 μm).

Preferably, the silver ink core component used in the process for providing the plurality of silver miniwires, comprises ≥60 wt % (more preferably ≥70 wt %; most preferably ≥75 wt %) silver nanoparticles dispersed in a silver carrier.

Preferably, the silver nanoparticles used in the silver ink core component exhibit an aspect ratio of ≤2 (more preferably ≤1.5; most preferably ≤1.1). The silver nanoparticles used optionally comprise a treatment or surface coating to facilitate the formation of a stable dispersion in the silver carrier and to inhibit the formation of agglomerates.

Silver carrier used in the process for providing the plurality of silver miniwires can be selected from any liquid in which the silver nanoparticles can be dispersed. Preferably, the silver carrier is selected from the group consisting of water, alcohol and mixtures thereof. More preferably, the silver carrier is selected from the group consisting of water; $C_{1-4}$ alcohol (e.g., methanol, ethanol, propanol, isopropanol, butanol); dimethyl sulfoxide; N,N-dimethyl formamide; 1-methyl-2-pyrrolidone; trimethyl phosphate and mixtures thereof. Most preferably, the silver carrier is water.

The silver ink core component used in the process for providing the plurality of silver miniwires, optionally, further comprises a core additive. Core additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred core additives include surfactants and antioxidants.

Preferably, the shell component used in the process for providing the plurality of silver miniwires comprises a film forming polymer dispersed in a shell carrier.

Film forming polymer used in the process for providing the plurality of silver miniwires can be selected from known electrospinnable film forming materials. Preferred film funning polymers include polyacrylic acid, polyethylene oxide, polyvinyl alcohol, polyvinyl propylene, cellulose (e.g., hydroxy propyl cellulose, nitrocellulose), silk and blends thereof More preferably, the film forming polymer is polyethylene oxide. Most preferably, the film forming polymer is polyethylene oxide having a weight average molecular weight of 10,000 to 1,000,000 g/mol.

Shell carrier used in the process for providing the plurality of silver miniwires can be selected from any liquid in which the film forming polymer is dispersible. Preferably, the shell carrier can be any good solvent for the film forming polymer. More preferably, the shell carrier is selected such that the interfacial tension between the shell component and the silver ink core component is $\geq 0.1$ mN/m (preferably, $\geq 1$ mN/m; more preferably, $\geq 2$ mN/m; still more preferably, 2 to 10 mN/m; most preferably, 2 to 5 mN/m). When used in combination with a silver ink core component having water as the silver carrier, the shell carrier is preferably selected from the group consisting of a water alcohol mixture; wherein the alcohol is selected from the group consisting of acetone, $C_{1-4}$ alcohols (e.g., methanol, ethanol, isopropanol, propanol, butanol, tert-butanol) and mixtures thereof; and wherein the water alcohol mixture exhibits an alcohol concentration of $\geq 50$ wt % (more preferably >50 wt %).

The shell component used in the process for providing the plurality of silver miniwires, optionally, further comprises a shell additive. Shell additives can be selected from the group consisting of surfactants, antioxidants, photoacid generators, thermal acid generators, quenchers, hardeners, dissolution rate modifiers, photocuring agents, photosensitizers, acid amplifiers, plasticizers, orientation control agents, and cross linking agents. Preferred shell additives include surfactants and antioxidants.

A particularly preferred shell component used in the process for providing the plurality of silver miniwires of the present invention, comprises 1 to 25 wt % (more preferably 1 to 15 wt %; most preferably 2 to 10 wt %) film forming polymer dispersed in a water and $C_{1-4}$ alcohol shell carrier. Preferably, the shell carrier is a water and $C_{1-4}$ alcohol mixture having an alcohol concentration $\geq 50$ wt % (most preferably $\geq 60$ wt % alcohol). Most preferably, the shell component comprises 2 to 10 wt % polyethylene oxide in a shell carrier, wherein the shell carrier is a water ethanol mixture having an ethanol content of $\geq 50$ wt %.

Optionally, the process for providing the plurality of silver miniwires of the present invention, further comprises: providing at least one additional shell component containing a film forming polymer dispersed in a shell carrier; and, coelectrospinning at least one additional shell component with the silver ink core component and the shell component depositing on the target a core shell fiber having a core and at least two shells surrounding the core, wherein the silver nanoparticles are in the core.

The target used in the process for providing the plurality of silver miniwires can be selected from any known materials both conductive and nonconductive. Preferred targets include glass (e.g., Willow® glass available from Corning, Inc.), plastic film (e.g., polyethylene, polyethylene terephthalate, polycarbonate, poly methyl methacrylate), metals (e.g., aluminum, copper), conductive treated papers, conductive treated nonwoven fabrics, conductive liquid baths (e.g., water, water electrolyte mixtures).

Preferably, the process for providing the plurality of silver miniwires of the present invention, comprises: providing a silver ink core component containing $\geq 60$ wt % (more preferably $\geq 70$ wt %; most preferably $\geq 75$ wt %) silver nanoparticles dispersed in a silver carrier; providing a shell component containing a film fanning polymer dispersed in a shell carrier; providing a target; coelectrospinning the silver ink core component and the shell component depositing on the target a core shell fiber having a core and a shell surrounding the core, wherein the silver nanoparticles are in the core; and, treating the silver nanoparticles to form a plurality of silver miniwires, wherein the plurality of silver miniwires exhibit an average length, L, of $\geq 10$ μm (preferably, $\geq 60$ μm; more preferably 60 to 10,000 μm; most preferably 100 to 10,000 μm).

Preferably, the process for providing the plurality of silver miniwires, comprises: providing a silver ink core component containing $\geq 60$ wt % (more preferably $\geq 70$ wt %; most preferably $\geq 75$ wt %) silver nanoparticles dispersed in a silver carrier; providing a shell component containing a film forming polymer dispersed in a shell carrier; providing a target; coelectrospinning the silver ink core component and the shell component depositing on the target a core shell fiber having a core and a shell surrounding the core, wherein the silver nanoparticles are in the core; and, treating the silver nanoparticles to form a plurality of silver miniwires, wherein the plurality of silver miniwires exhibit an average diameter, D, of 10 nm to 5 μm (preferably 100 nm to 5 μm; more preferably 1 to 5 μm) and an average length, L, of $\geq 10$ (preferably, $\geq 60$; more preferably, 60 to 10,000 μm; most preferably 100 to 10,000 μm). Preferably, the silver miniwires exhibit an aspect ratio, L/D, of $\geq 100$ (more preferably $\geq 150$; still more preferably $\geq 200$; most preferably 200 to 10,000).

Preferably, in the process for preparing the plurality of silver miniwires, the silver nanoparticles in the core shell fiber deposited on the target are treated using a technique selected from the group consisting of sintering (e.g., photosintering, theinial sintering); heating (e.g., burn-off, micro pulse photonic heating, continuous photonic heating, microwave heating, oven heating, furnace heating) and a combination thereof. Preferably, the silver nanoparticles in the core shell fiber deposited on the target are treated by photosintering.

Preferably, the process for preparing the plurality of silver miniwires, comprises feeding the silver ink core component and the shell component through a coannular nozzle having a central opening and a surrounding annular opening, wherein the silver ink core component is fed through the central opening and the shell component is fed through the surrounding annular opening. Preferably, the ratio of the volumetric flow rate of the shell material, $VFR_{shell}$, fed through the surrounding annular opening to the volumetric flow rate of the core material, $VFR_{core}$, fed through the central opening is greater than or equal to the ratio of the cross sectional area of the surrounding annular opening perpendicular to the direction of flow, $CSA_{annular}$, to the cross sectional area of the central opening perpendicular to the direction of flow, $CSA_{center}$. More preferably, the following expression is satisfied by the processing conditions:

$$VFR_{shell}/VFR_{core} \geq 1.2*(CSA_{annular}/CSA_{center}).$$

Most preferably, the following expression is satisfied by the processing conditions:

$$VFR_{shell}/VFR_{core} \geq 1.4*(CSA_{annular}/CSA_{center}).$$

Preferably, in the process for providing the plurality of silver miniwires, the silver ink core component is fed through the central opening at a volumetric flow rate of 0.1 to 3 µL/min (preferably 0.1 to 1 µL/min; more preferably 0.1 to 0.7 µL/min; most preferably 0.4 to 0.6 µL/min).

Preferably, in the process for providing the plurality of silver miniwires, the shell component is fed through the surrounding annular opening at a flow of 1 to 30 µL/min (preferably 1 to 10 µL/min; more preferably 1 to 7 µL/min; most preferably 4 to 6 µL/min).

Preferably, in the process for providing the plurality of silver miniwires, the coannular nozzle is set at an applied positive difference of electric potential relative to the substrate. More preferably, wherein the applied electric potential difference is 3 to 50 kV (preferably, 4 to 30 kV; more preferably, 5 to 25 kV; most preferably, 5 to 10 kV).

The plurality of nonconductive spheres used in the method of the present invention are not particular limiting. One of ordinary skill in the art given the teachings provided herein will be able to selected appropriate nonconductive spheres for use in the method of the present invention. Preferably, the plurality of nonconductive spheres are selected from polystyrene spheres and glass spheres. More preferably, the plurality of nonconductive spheres are glass spheres.

Preferably, the plurality of nonconductive spheres used in the method of the present invention have an average particle size of 0.1 to 300 µm. More preferably, the plurality of nonconductive spheres used in the method of the present invention have an average particle size of 10 to 300 µm. Still more preferably, the plurality of nonconductive spheres used in the method of the present invention have an average particle size of 20 to 200 µm. Yet still more preferably, the plurality of nonconductive spheres used in the method of the present invention have an average particle size of 50 to 200 µm. Most preferably, the plurality of nonconductive spheres used in the method of the present invention have an average particle size of 70 to 200 µm. The average particle size of the nonconductive spheres can be measured using well known low angle laser light scattering laser diffraction.

The optional matrix material used in the method of the present invention is not particularly limiting. One of ordinary skill in the art will be able to select an appropriate matrix material based on the desired end use application for the film prepared using the method of the present invention. Preferably, the matrix material is selected from the group consisting of polyethylene, polypropylene, polyvinyl chloride, styrenic, polyurethane, polyimide, polycarbonate, polyethylene terephthalate, cellulose, gelatin, chitin, polypeptides, polysaccharides and mixtures thereof. More preferably, the matrix material is selected from the group consisting of transparent cellulose ester polymers and transparent cellulose ether polymers.

The optional vehicle used in the method of the present invention is not particularly limiting. One of ordinary skill in the art will be able to select an appropriate vehicle for use with the method of the present invention. Preferably, the vehicle is selected from the group consisting of organic solvents and aqueous solvents. More preferably, the vehicle is selected from $C_{1-5}$ alcohols, toluene, xylene, methyl ethyl ketone (MEK), water and mixtures thereof. Most preferably, the vehicle is water.

The plurality of silver miniwires, the plurality of nonconductive spheres, the optional matrix material and the optional vehicle can be combined to form the combination using well known mixing techniques.

Preferably, the combination used in the method of the present invention includes 2 to 15 wt % (more preferably 2 to 10 wt %) silver miniwires; 10 to 20 wt % nonconductive spheres; 5 to 70 wt % (more preferably 5 to 20 wt %) matrix material; 0 to 85 wt % (more preferably 50 to 75 wt %) vehicle.

The combination can be applied to the surface of the substrate using well known deposition methods. Preferably, the combination is applied to a surface of the substrate using a process selected from the group consisting of spray painting, dip coating, spin coating, knife coating, kiss coating, gravure coating, screen printing, ink jet printing and pad printing. More preferably, the combination is applied to a surface of the substrate using a process selected from the group consisting of dip coating, spin coating, knife coating, kiss coating and gravure coating. Most preferably, the combination is applied to a surface of the substrate by spin coating.

Preferably, any volatile components contained in the combination deposited on the surface of the substrate are removed from the film formed on the substrate. Preferably, the volatile components are removed by baking the film formed on the substrate. Preferably, the concentration of silver miniwires in the film post removal of the volatile components is 10 to 40 wt % (more preferably 15 to 35 wt %; most preferably 15 to 25 wt %).

Preferably, the film formed on the surface of the substrate using the method of the present invention exhibits a reduced sheet resistance. Preferably, the sheet resistance exhibited by the film deposited using the method of the present invention is at least 30% lower (more preferably, at least 50% lower; most preferably at least 80% lower) than that of a film deposited using the comparative method.

Some embodiments of the present invention will now be described in detail in the following Examples.

The plurality of nonconductive glass spheres used in the following Examples were obtained from Prixmalite (P2075SL). The glass spheres were reported to have an average diameter of 67 µm and exhibited a refractive index of 1.5.

The pluralities of nonconductive polystyrene (PS) spheres used in the following Examples were prepared using conventional techniques. The pluralities of nonconductive polystyrene spheres used exhibited average diameters of 20 µm, 45 µm, 73 µm, 100 µm, 156 µm and 200 µm. The pluralities of nonconductive polystyrene spheres used all exhibited a refractive index of 1.59.

The silver miniwires used in the following Examples were obtained from Blue Nano (SLV BN 90). The silver miniwires used were reported by Blue Nano to exhibit an average diameter of 90 nm and lengths of 20 to 60 gm. The silver miniwires were provided in combination with an optional vehicle, isopropyl alcohol solution, at a silver concentration of 2.5 wt %.

The matrix material used in the following Examples was Methocel® K100M (available from Dow Wolff Cellulosics) diluted in water at a concentration of 0.5 wt %.

COMPARATIVE EXAMPLES C1-C5 AND EXAMPLES 1-19

Preparation of Combination for Film Deposition

In Comparative Examples C1-05 and Examples 1-19, a combination comprising a plurality of silver miniwires, a plurality of nonconductive spheres, a matrix material (Methoeel®) and water were prepared by physically combining in a flask outfitted with a magnetic stir bar the materials identified and in the amounts noted in TABLE 1. Specifically, the silver miniwire solution in isopropyl alcohol as obtained from Blue Nano was measured out and added to the flask to provide the mass of silver miniwires noted in TABLE 1. The plurality of nonconductive spheres noted in TABLE 1 in dry form were then added to the silver miniwire solution in the flask. The Methocel® was combined with water was then added to the contents of the beaker to form the desired combination.

TABLE 1

| Ex. | Spheres Material | Spheres avg. dia (μm) | Silver Miniwires (g) | Spheres (g) | Methocel ® (g) | Water (g) |
|---|---|---|---|---|---|---|
| C1 | — | — | 0.35 | — | 3.2 | 0.44 |
| C2 | — | — | 0.21 | — | 3.2 | 0.58 |
| C3 | — | — | 0.16 | — | 3.2 | 0.63 |
| C4 | — | — | 0.16 | — | 3.2 | 0.63 |
| C5 | — | — | 0.11 | — | 3.2 | 0.68 |
| 1 | PS | 73 | 0.39 | 0.64 | 0.4 | 2.6 |
| 2 | PS | 156 | 0.39 | 0.64 | 0.4 | 2.6 |
| 3 | PS | 200 | 0.39 | 0.64 | 0.4 | 2.6 |
| 4 | PS | 73 | 0.24 | 0.64 | 0.4 | 2.7 |
| 5 | PS | 156 | 0.24 | 0.64 | 0.4 | 2.7 |
| 6 | PS | 200 | 0.24 | 0.64 | 0.4 | 2.7 |
| 7 | PS | 73 | 0.18 | 0.64 | 0.4 | 2.8 |
| 8 | PS | 156 | 0.18 | 0.64 | 0.4 | 2.8 |
| 9 | PS | 200 | 0.18 | 0.64 | 0.4 | 2.8 |
| 10 | PS | 73 | 0.13 | 0.64 | 0.4 | 2.8 |
| 11 | PS | 156 | 0.13 | 0.64 | 0.4 | 2.8 |
| 12 | PS | 200 | 0.13 | 0.64 | 0.4 | 2.8 |
| 13 | glass | 67 | 0.24 | 0.02 | 0.4 | 3.3 |
| 14 | glass | 20 | 0.16 | 0.64 | — | 3.2 |
| 15 | glass | 45 | 0.16 | 0.64 | — | 3.2 |
| 16 | glass | 73 | 0.16 | 0.64 | — | 3.2 |
| 17 | glass | 100 | 0.16 | 0.64 | — | 3.2 |
| 18 | glass | 156 | 0.16 | 0.64 | — | 3.2 |
| 19 | glass | 200 | 0.16 | 0.64 | — | 3.2 |

EXAMPLE 20-43

Spin Coating of Films

The combination prepared according to each of Comparative Examples C1-C5 and Examples 1-13 was spin coated onto a glass slide at 1,500 rpm and then dried in an oven set at 120 ° C. for 5 minutes to form a product film in Examples 20-37, respectively.

The combination prepared according to each of Examples 14-19 was spin coated onto a glass slide at 1,000 rpm and then dried in an oven set at 120 ° C. for 5 minutes to form a product film in Examples 38-43, respectively.

EXAMPLE 44

Film Properties

The films deposited in Examples 20-43 were analyzed for haze, total transmission and sheet resistance. The results of these analyses are provided in TABLE 2.

Haze and total transmission values for the films reported in TABLE 2 were measured using a HunterLab Ultra Scan XE spectrophotometer according to ASTM D1003-11 e1.

Direct transmission values for the films was measured using a Hewlett Packard 8453 UV vis spectrometer, with the glass background subtracted.

Sheet resistance values for the films reported in TABLE 2 were measured using a 4 point probe apparatus according to SEMI MF84-02: Test Method for Measuring Resistivity of Silicon Wafers With an In-Line Four-Point Probe, which was last published by ASTM International as ASTM F 84-02. Several measurements were made per sample and the average values are reported in TABLE 2.

TABLE 2

| Film Ex. | Material | Haze (%) | Transmission Total (%) | Transmission Direct (%) | Sheet Resistance (Ω/sq) |
|---|---|---|---|---|---|
| 20 | Ex. C1 | 3.83 | 88.40 | 92.50 | 37.4 |
| 21 | Ex. C2 | 2.57 | 89.94 | 95.38 | 361.0 |
| 22 | Ex. C3 | 2.22 | 90.19 | 96.11 | 125,000.0 |
| 23 | Ex. C4 | 1.59 | 90.14 | 97.48 | 2,520.0 |
| 24 | Ex. C5 | 1.20 | 90.50 | 98.56 | — |
| 25 | Ex. 1 | 4.51 | 87.54 | 89.60 | 24.3 |
| 26 | Ex. 2 | 3.28 | 88.58 | 93.64 | 36.8 |
| 27 | Ex. 3 | 3.75 | 87.99 | 92.01 | 25.6 |
| 28 | Ex. 4 | 2.11 | 89.94 | 95.66 | 149.0 |
| 29 | Ex. 5 | 2.33 | 89.95 | 94.82 | 165.0 |
| 30 | Ex. 6 | 3.29 | 88.58 | 92.88 | 27.1 |
| 31 | Ex. 7 | 1.96 | 90.17 | 96.27 | 183.0 |
| 32 | Ex. 8 | 1.89 | 90.30 | 96.61 | 207.0 |
| 33 | Ex. 9 | 1.66 | 90.41 | 97.09 | 283.0 |
| 34 | Ex. 10 | 1.43 | 90.75 | 97.26 | 614.0 |
| 35 | Ex. 11 | 1.46 | 90.63 | 97.74 | 474.0 |
| 36 | Ex. 12 | 1.43 | 90.64 | 97.37 | 652.0 |
| 37 | Ex. 13 | 1.31 | 90.09 | 98.03 | 195.0 |
| 38 | Ex. 14 | 3.65 | 88.70 | 93.54 | 59.3 |
| 39 | Ex. 15 | 3.20 | 89.11 | 93.51 | 620.0 |
| 40 | Ex. 16 | 3.14 | 88.66 | 93.49 | 63.6 |
| 41 | Ex. 17 | 2.90 | 89.04 | 93.95 | 70.4 |
| 42 | Ex. 18 | 3.85 | 88.41 | 91.75 | 45.5 |
| 43 | Ex. 19 | 3.28 | 88.64 | 92.79 | 49.5 |

Electrospun Miniware Examples

A dual nozzle electrospinning machine Model EC-DIG from IME Technologies was used to electrospin silver miniwires in the Examples. The nozzle used in the Examples was a coaxial nozzle (EM-CAX from IME Technologies) having an inner opening having a circular cross section perpendicular to the direction of material flow having a 0.4 mm diameter; and, an outer opening having an annular cross section perpendicular to the direction of material flow and concentric with the inner opening; and having a 0.6 mm inner diameter and a 1.2 mm outer diameter. When spinning material, the silver ink core component was fed through the inner opening of the coaxial nozzle and the shell component was fed through the outer opening of the coaxial nozzle. The silver ink core component and the shell component were fed through the coaxial nozzle using independent syringe pumps (EP-NE1 from IME Technologies) controlling the volumetric flow rate of the silver ink core component, $VFR_{core}$, at 0.5 μL/min and the volumetric flow rate of the shell component, $VFR_{shell}$, at 5 μL/min. The electrospinning process in the Examples was performed at ambient atmospheric conditions in a climate controlled laboratory at 20° C. and relative humidity of 25-35%.

The substrate used for collecting the fibers in the Examples was a 0.16-0.19 mm thick glass slide having a 60 mm diameter. During the spinning operation, the glass plate was placed on top of a grounded electrode while the spinning head was located vertically above the substrate. A positive electric potential was applied to the spinning head during spinning. The voltage used in the Examples varied from 9 kV at the start of spinning down to 7 kV once the spinning process became stable.

Photonic sintering referred to in the Examples was performed using a Pulseforge 3100 photon generator available from Novacentrix. The photon generator was outfitted with a high intensity xenon lamp capable of emitting light over a broad spectrum from UV to short IR. The photon generator was set up at 350 V to produce 400 μsec pulses with a 5 Hz frequency on continuous mode generating 2.46 J/cm$^2$. The samples were fed through the photon generator on a conveyor belt at a rate of 7.62 m/min.

EXAMPLE 21

Silver Miniwire Preparation by Coaxial Electrospinning

Silver miniwires were electrospun and deposited onto a glass slide substrate. The silver ink core component used comprised 75 wt % silver nanoparticles with a nominal particle size of 50 nm dispersed in water (Available from Cabot Corporation as CSD-95). The shell component used comprised 6 wt % polyethylene oxide (400,000 g/mol from Aldrich) dissolved in a 40/60 wt % water/ethanol solution; wherein the interfacial tension between the silver ink core component and the shell component was measured to be 2-5 mN/m.

The post sintered product silver miniwires were analyzed by optical microscopy and observed to exhibit silver miniwires having diameters in the 1-5 μm range and lengths in the 800-1,000 μm range.

COMPARATIVE EXAMPLE A1

The silver ink core component used comprised 60 wt % silver nanoparticles dispersed in water (Available from PChem Associates, Inc. as PFI-722 ink). A variety of shell components were used including the following:
  6 wt % polyacrylic acid in water;
  4 wt % polyethylene oxide in a 60/40 wt % ethanol/water mixture;
  6 wt % polyethylene oxide in a 60/40 wt % isopropanol/water mixture;
  8 wt % polyacrylic acid in a 30/20/50 wt % water/isopropanol/butanol mixture;
  4-6 wt % polyethylene oxide in a 60/40 wt % ethanol/water mixture;
  4-8 wt % polyacrylic acid in a 60/40 wt % ethanol/water mixture; and,
  4-8 wt % polyacrylic acid in a 40/60 wt % ethanol/water mixture.
The interfacial tension between the silver ink core component and the shell component in each of these systems was measured to be 0.4-2 mN/m.

Efforts to produce silver miniwires using this silver ink core component combined with the listed shell components were all unsuccessful.

COMPARATIVE EXAMPLE A2

The silver ink core component used comprised 60 wt % silver nanoparticles dispersed in water (Available from PChem Associates, Inc. as PFI-722 ink). A variety of shell components were used including the following:
  6 wt % polyacrylic acid in water;
  4 wt % polyethylene oxide in a 60/40 wt % ethanol/water mixture;
  6 wt % polyethylene oxide in a 60/40 wt % isopropanol/water mixture;
  8 wt % polyacrylic acid in a 30/20/50 wt % water/isopropanol/butanol mixture;
  4-6 wt % polyethylene oxide in a 60/40 wt % ethanol/water mixture;
  4-8 wt % polyacrylic acid in a 60/40 wt % ethanol/water mixture; and,
  4-8 wt % polyacrylic acid in a 40/60 wt % ethanol/water mixture.
The interfacial tension between the silver ink core component and the shell component in each of these systems was measured to be 0.4-2 mN/m.

Efforts to produce silver miniwires using this silver ink core component in combination individually with each of the listed shell components by coelectrospinning process (as described above and as used in Example 21) were all unsuccessful.

We claim:
1. A method of manufacturing a silver miniwire film, comprising:
  providing a substrate;
  providing a plurality of silver miniwires, wherein the plurality of silver miniwires are provide by: providing a silver ink core component containing >60 wt % silver nanoparticles dispersed in a silver carrier, wherein the silver carrier is water; providing a shell component containing a film forming polymer dispersed in a shell carrier, wherein the shell carrier is a water alcohol mixture, wherein the water alcohol mixture contains ≥50 wt % alcohol; wherein the silver carrier and the shell carrier are selected such that the interfacial tension between the shell component and the silver ink core component is 2 to 10 mN/m; providing a target;
  coelectrospinning the silver ink core component and the shell component thereby depositing on the target a core shell fiber having a core and a shell surrounding the core, wherein the silver nanoparticles are in the core; treating the silver nanoparticles to form the plurality of silver miniwires, wherein the plurality of silver miniwires exhibit an average length, L, of >10 μm; and, recovering the plurality of silver miniwires;
  providing a plurality of nonconductive spheres, wherein the plurality of nonconductive spheres have an average particle size of ≤300 μm;
  optionally, providing a matrix material;
  optionally, providing a vehicle;
  combining the plurality of silver miniwires, the plurality of nonconductive spheres, the optional matrix material and the optional vehicle to form a combination;
  applying the combination to a surface of the substrate to form a film;
  removing any volatile components from the film formed on the substrate;
  wherein the film formed on the surface of the substrate exhibits a reduced sheet resistance.
2. The process of claim 1, wherein the silver nanoparticles are treated by photosintering.
3. The process of claim 1, wherein the coelectrospinning comprises feeding the silver ink core component and the shell component through a coannular nozzle having a central opening and a surrounding annular opening, wherein the silver ink core component is feed through the central opening and the shell component is feed through the surrounding annular opening.

4. The process of claim 3, wherein the coannular nozzle is set at an applied positive difference of electric potential relative to the substrate.

5. The process of claim 3, wherein the coannular nozzle is set at an applied positive difference of electric potential relative to the target of 3 to 50 kV.

6. The process of claim 1, wherein the silver nanoparticles exhibit an aspect ratio (L/D) of ≤2.

7. The process of claim 6, wherein the silver ink core component is fed through a central opening at a flow rate of 0.1 to 3 µL/min and the shell component is fed through a surrounding annular opening at a flow of 1 to 30 µL/min.

* * * * *